(12) United States Patent
Lo et al.

(10) Patent No.: US 7,259,462 B1
(45) Date of Patent: Aug. 21, 2007

(54) INTERCONNECT DIELECTRIC TUNING

(75) Inventors: Wai Lo, Lake Oswego, OR (US); Hong Lin, Vancouver, WA (US); Shiqun Gu, Vancouver, WA (US); Wilbur G. Catabay, Saratoga, CA (US); Zhihai Wang, Sunnyvale, CA (US); Wei-Jen Hsia, Saratoga, CA (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 11/419,548

(22) Filed: May 22, 2006

Related U.S. Application Data

(62) Division of application No. 10/915,719, filed on Aug. 10, 2004, now Pat. No. 7,081,406.

(51) Int. Cl.
*H01L 23/48* (2006.01)
*H01L 23/52* (2006.01)
*H01L 29/40* (2006.01)

(52) U.S. Cl. ................................. 257/750; 438/614
(58) Field of Classification Search ................ 257/750, 257/760, 774, 784; 438/614, 620, 622, 625, 438/669
See application file for complete search history.

(56) References Cited

U.S. PATENT DOCUMENTS 5,559,055 A * 9/1996 Chang et al. ............... 438/586

* cited by examiner

*Primary Examiner*—Phuc T. Dang
(74) *Attorney, Agent, or Firm*—Luedeka Neely & Graham

(57) ABSTRACT

An improvement to a method of forming an integrated circuit. An etch stop layer is formed to overlie the front end processing layers of the integrated circuit. Support structures are formed that are disposed so as to support electrically conductive interconnects on various levels of the integrated circuit. Substantially all of the non electrically conductive layers above the etch stop layer that were formed during the fabrication of the interconnects are removed.

4 Claims, 4 Drawing Sheets

INTERCONNECT DIELECTRIC TUNING

This application is a divisional of U.S. patent application Ser. No. 10/915,719, filed 2004 Aug. 10, now U.S. Pat. No. 7,081,406. This invention relates to the field of integrated circuit fabrication. More particularly, this invention relates to methods and structures for reducing the capacitance between electrically conductive elements of an integrated circuit, as the integrated circuit is made smaller.

FIELD

This invention relates to the field of integrated circuit fabrication. More particularly, this invention relates to methods and structures for reducing the capacitance between electrically conductive elements of an integrated circuit, as the integrated circuit is made smaller.

BACKGROUND

For each succeeding generation of integrated circuits, both transistor speed and density has increased. As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

To increase the transistor density of integrated circuits, the metal line width, via diameters, and space for electrically conductive interconnects has been reduced during the succeeding generations. This reduction in the size of electrically conductive line spacing tends to increase the capacitance effects that exist between the conductive elements, which in turn tends to increase the resistance-capacitance delay exhibited by the interconnections, and further results in a delay in the overall response of the integrated circuit. At the 130 nanometer gate technology node, the metal interconnect resistance-capacitance delay becomes an significant factor in the design speed of the integrated circuit.

To address this delay issue, the semiconductor fabrication industry has widely adapted the use of copper as an electrically conductive interconnect material, to generally replace aluminum. This use of copper is an effort to reduce the resistivity of interconnect structure. On the other hand, to reduce the capacitance between interconnects, the dielectric constant, or k value, of the electrically insulating materials disposed between the interconnects is desirably reduced. Thus, fluorine doped silicon dioxide, which has a k value of about 3.7, was introduced at the 180 nanometer technology node. However, the practice of adapting those electrically insulating materials that have a k value of between about 2.6 and 3.0 for the 130 nanometer technology node has introduced problematic process, reliability, and yield issues.

The integration of materials on the lower end of the k value range has proven to be even more challenging. One difficulty involved in the integration of these so-called low k materials is that to achieve a dielectric constant of less than about 2.9, the low k materials generally need to be porous. The porous low-k dielectric materials tend to be very fragile and lack mechanical strength, and thus present tremendous challenges for the back-end process technologies such as dielectric deposition, chemical mechanical polishing, and etching.

For example, FIG. 1 depicts cracking 3 of a low-k film 5 after an anneal process. FIG. 2 depicts a trench 7 formed in a low k material 9, after exposure to an oxygen plasma that has aggressively attacked the porous low k material. Thus, further reduction of dielectric k values and fabricating interconnect structures that are compatible with the new materials and processes tend to be some of the major challenges of back-end processing. Various solutions have been proposed for these problems. For example, the industry can continue to develop low k materials and deposition technologies, and implement barrier layers to protect the low k structures. Another option is to continue to develop new process technologies such as via etch, trench etch, dielectric chemical mechanical polishing, and interconnect deposition for each new generation of low k film. A further option is to continue to invest in new equipment that is designed to overcome these issues in some manner.

However, all of the options thus presented tend to have one or more severe disadvantage. For example, the inherent problems of fragility, lack of mechanical strength, and weak chemical properties for porous low k materials are hard to overcome from the process and integration perspective. The difficulties associated with processing and integration of the low k materials tend to increase dramatically with the decrease of the k value. These difficulties tend to limit the scalability of continuing to reduce the k value of the insulating materials. Additionally, there are reliability and yield issues associated with the processing and integration of low k materials. Such solutions tend to require a relatively large capital investment, and tend to delay the time to market of the integrated circuits so fabricated.

What is needed, therefore, is a system that at least reduces in part some of the problems described above.

SUMMARY

The above and other needs are met by an improvement to a method of forming an integrated circuit. An etch stop layer is formed to overlie the front end processing layers of the integrated circuit. Support structures are formed that are disposed so as to support electrically conductive interconnects on various levels of the integrated circuit. Substantially all of the non electrically conductive layers above the etch stop layer that were formed during the fabrication of the interconnects are removed.

In this manner, the embodiments of the present invention tend to avoid the use of increasingly sophisticated—and expensive—process technologies, such as those related to porous low k films. In addition, because there is substantially no material, except perhaps for a gas such as air, between the interconnect structures, a k value approaching that of the optimum value of one is achieved. The support posts that are built into the interconnect structures to provide mechanical support for the upper layers can be designed during the integrated circuit layout, and implemented during processing. Thus, the back end processing is significantly simplified as compared to other solutions.

In various embodiments, the etch stop layer is formed of a material that etches at a substantially slower rate than the non electrically conductive layers. Preferably, the etch stop layer is formed of at least one of silicon nitride and silicon carbide. In some embodiments the support structures are formed at least in part of the same material that is used to form the interconnects. Preferably, the support structures are formed of metal, and most preferably are formed substantially of copper. The interconnects are preferably formed of metal, and are most preferably formed substantially of copper.

The step of removing the non electrically conductive layers preferably includes etching the non electrically conductive layers with at least one of an acid solution, a solvent solution, and a plasma etch. In some embodiments, a passivation layer is formed prior to the step of removing the non electrically conductive layers, where the passivation layer etches at a substantially slower rate than the non electrically conductive layers. In some embodiments, a void within the passivation layer is filled with an inert gas, or a vacuum is drawn and maintained within the void, after the step of removing the non electrically conductive layers. Some embodiments selectively retain desired ones of the non electrically conductive layers to help support the interconnects, or selectively backfill desired layers with a dielectric material to help support the interconnects.

According to another aspect of the invention there is described an integrated circuit having various improvements. An etch stop layer overlies the front end processing layers of the integrated circuit. Support structures are disposed so as to support electrically conductive interconnects on various levels of the integrated circuit. Substantially complete voids are disposed between the interconnects, where the voids are caused by removing substantially all non electrically conductive layers above the etch stop layer that were formed during fabrication of the interconnects.

In various preferred embodiments according to this aspect of the invention, the etch stop layer is formed of at least one of silicon nitride and silicon carbide. The support structures are preferably formed at least in part of a material that is used to form the interconnects. Preferably, at least one of the support structures and the interconnects are formed of metal. Most preferably, a passivation layer overlies the interconnects. The passivation layer forms a void, which in various embodiments is filled with one of an inert gas, air, and a vacuum.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
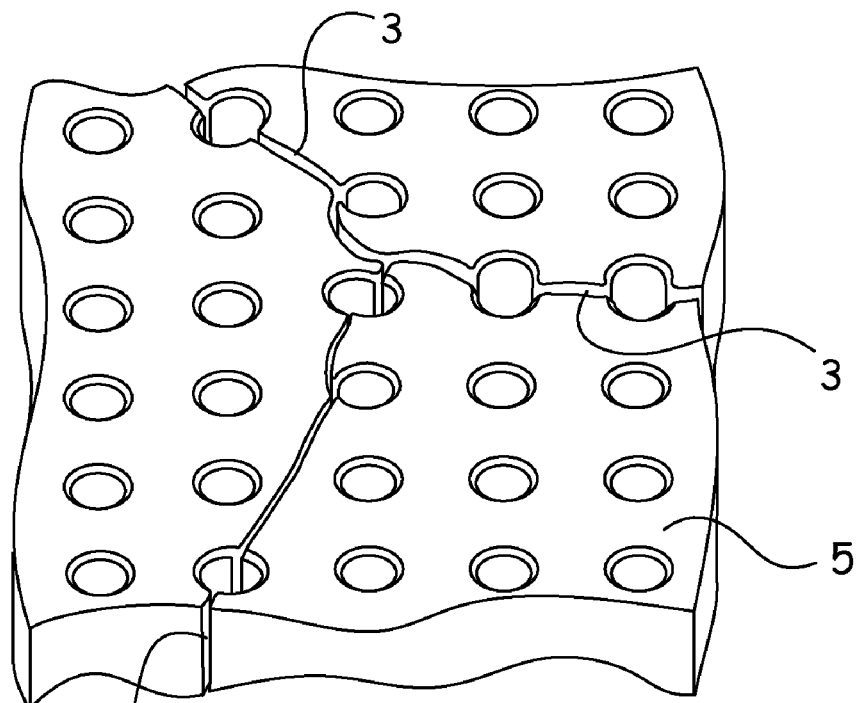
FIG. 1 depicts a low k film that has cracked as a result of an anneal process.
Figure 2:
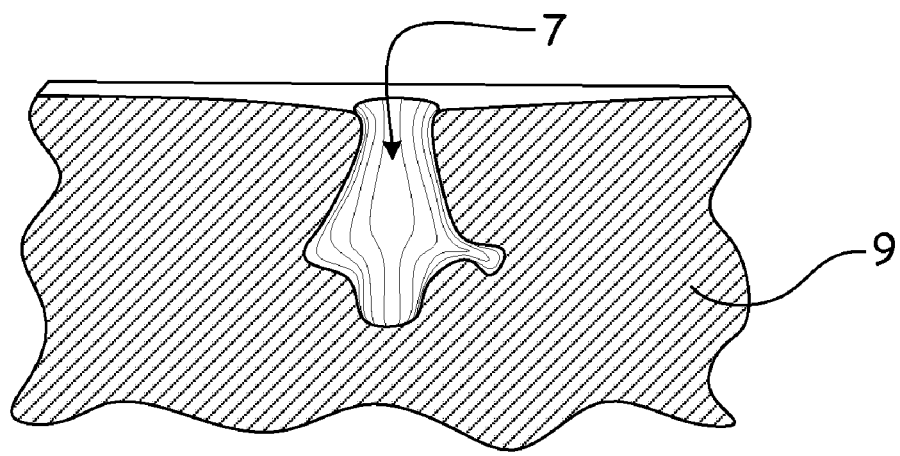
FIG. 2 depicts a trench in a low k film that has become misshapen during an etching process.
Figure 3:
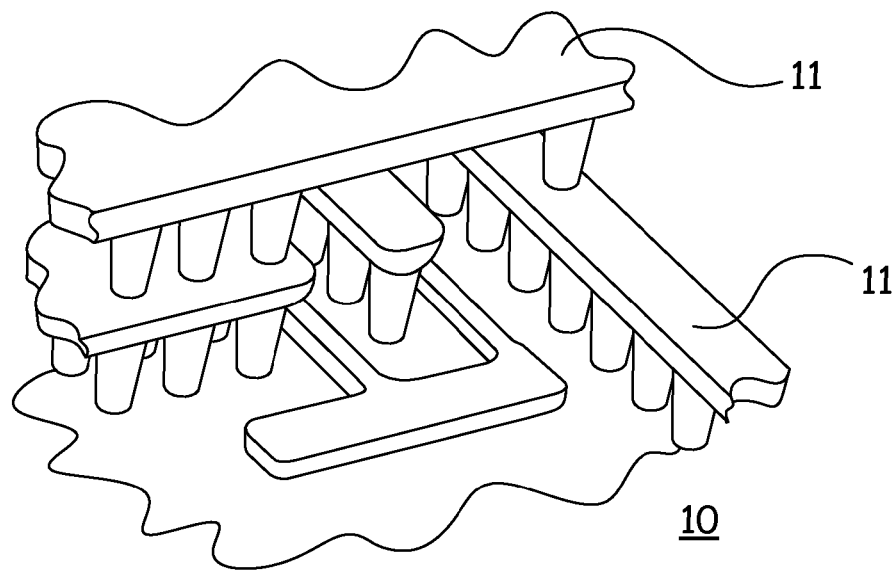
FIG. 3 depicts electrically conductive interconnect layers, supported by posts, where the inter metal dielectric layers, used during the formation of the interconnect layers, have been substantially removed.

The various embodiments of the invention are somewhat based on the principle that air has a k value that is nearly that of a vacuum, which is about one, which is defined to be the lowest k value that can be achieved. Thus, instead of continuing the development of low k films, deposition, and other related process technologies, the present invention proposes to use conventional oxide deposition such as HDP or PSG for the back-end inter metal dielectric processes, and reduce the k value between the interconnects by stripping these oxide layers after the completion of all back-end interconnection processing. The mechanical support of the upper layers is addressed from the integrated circuit design standpoint. FIG. 3 depicts the interconnect layers 11 of such an integrated circuit 10, after the inter metal dielectrics have been stripped away.

Because it can use conventional inter metal dielectric processes, such as HDP or PSG deposition technology, during the back end metal interconnection fabrication cycles, the present invention tends to avoid the use of increasingly sophisticated process technologies, such as those related to porous low k films. In addition, because there is substantially no material, except perhaps for a gas such as air, between the interconnect structures, a k value approaching that of the optimum value of one is achieved. Preferably, posts are built into the interconnect structures to provide mechanical support for the upper layers. These posts can be designed during the integrated circuit layout, and implemented during processing. Thus, the back end processing is significantly simplified as compared to other solutions.

Described below is a process flow for a single damascene architecture, as an illustration of the present invention. However, it is appreciated that similar concepts can be applied for dual damascene and other architectures.

Figure 4:
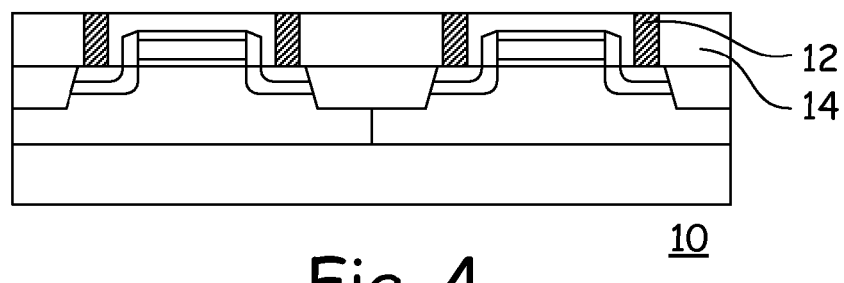
FIG. 4 is a cross sectional depiction of an integrated circuit after front end processing has been completed.

FIG. 4 depicts a cross sectional representation of an integrated circuit 10 after the devices have been formed in the substrate, and electrically conductive vias 12 have been formed in a dielectric material 14. At this stage of the processing, front end processing is considered to be completed, and back end processing is starting. It is predominantly from these steps forward that the embodiments of the present invention are applied.

Figure 5:
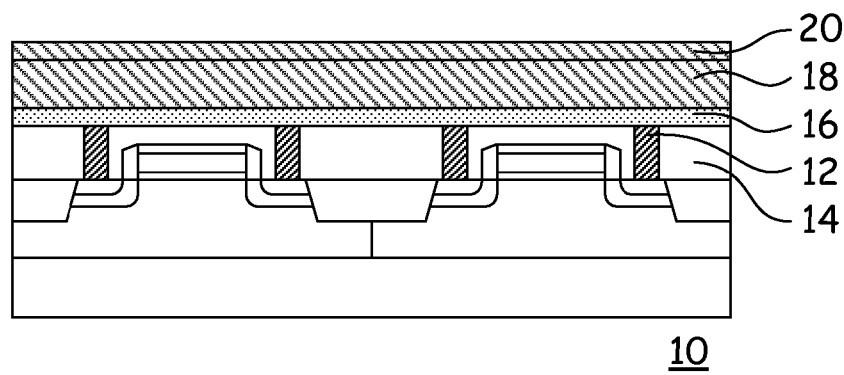
FIG. 5 is a cross sectional depiction of an integrated circuit after an etch stop layer, inter metal dielectric layer, and anti reflective coating have been formed.

As depicted in FIG. 5, an etch stop layer 16 is preferably formed over the integrated circuit 10. The etch stop layer 16 is preferably formed of a dielectric material, such as silicon nitride or silicon carbide. The etch stop layer 16 preferably serves two functions. First, it is preferably an etch stop for the metal 1 trench etch that will subsequently be performed, and second, it prohibits stripping of underlying layers during the last, dilute hydrofluoric acid strip that is used to achieve the desired low k values. An inter metal dielectric layer 18 is preferably formed over the etch stop layer 16. The inter metal dielectric layer 18 is preferably formed using a convention process, such as high density plasma or phosphosilicate glass. An optional anti reflective coating 20 is formed on top of the combined structure.

Figure 6:
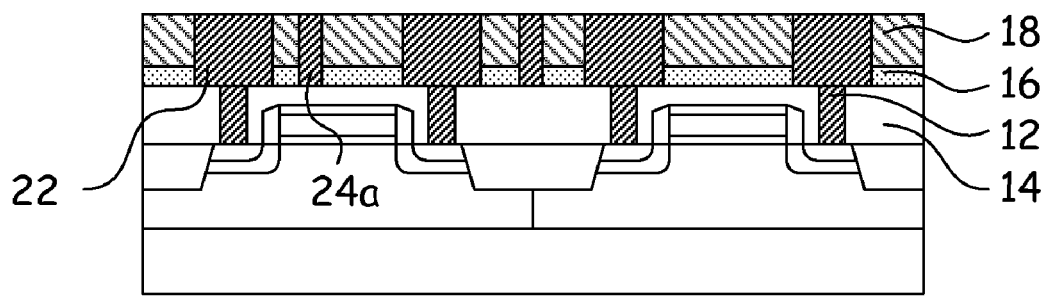
FIG. 6 is a cross sectional depiction of an integrated circuit after M1 structures and support structures have been formed.

The 16, 18, and 20 are preferably masked, such as by using a photolithographic process, and trenches are preferably etched in layers, in which electrically conductive M1 structures 22 are formed, as depicted in FIG. 6. Most preferably, additional post support structures 24a are also formed during the M1 process, so as to provide the structural stability that will be required when the dielectric materials between the electrically conductive structures are stripped. It is appreciated that, at this stage of the processing, standard materials and processes can be used to form the M1 structures 22 and 24a, and that the only change that is preferably added to the process at this point is the addition of the support structures 24a in the mask designs.

Figure 7:
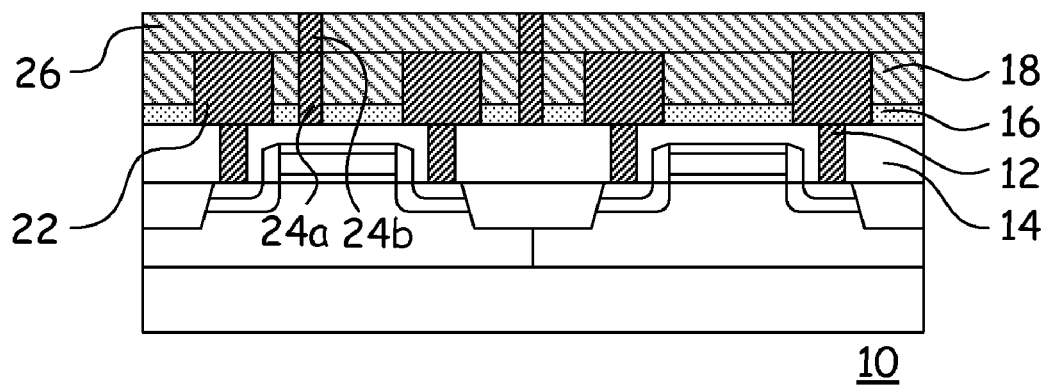
FIG. 7 is a cross sectional depiction of an integrated circuit after support extensions have been formed over the support structures.

As depicted in FIG. 7, an inter metal dielectric layer 26 is preferably formed over the combined structure. The inter metal dielectric layer 16 is preferably formed using a convention process, such as high density plasma or phosphosilicate glass. An optional anti reflective coating may again be formed on top of the combined structure. The dielectric layer 26 is preferably masked, such as by using the processes described above, and etched so at to form voids in which support extensions 24b are formed on top of the support posts 24a, as depicted in FIG. 7.

Figure 8:
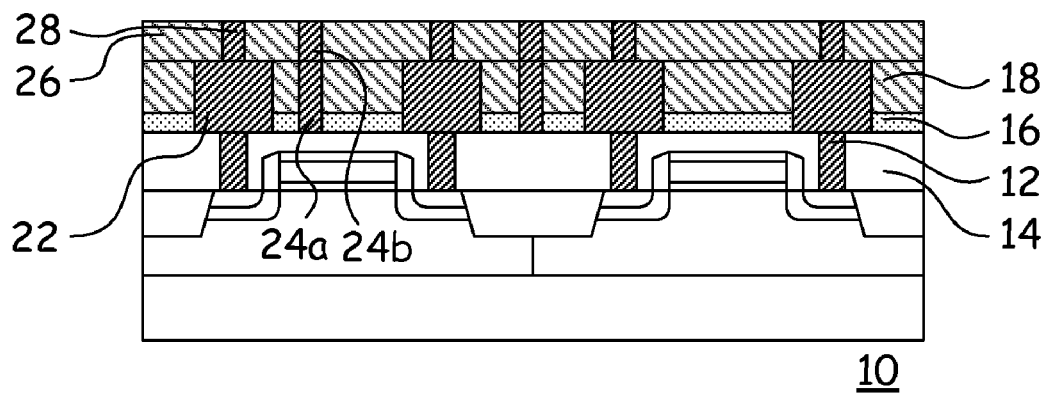
FIG. 8 is a cross sectional depiction of an integrated circuit after via 1 structures have been formed.

The dielectric layer 26 is also additionally masked and processed to form standard via 1 structures 28, as depicted in FIG. 8. In various embodiments, the extensions 24b and the via 1 structures 28 are formed using different masking cycles, or the same masking cycle. The choice of which process to use preferably depends at least in part on the materials that are desired for use of the via 1 structures 28 and the extensions 24b. If the same material is either desired or merely permissible, then the via 1 structures 28 and the extensions 24b can be formed during the same masking cycle, using a via 1 mask that has been altered to include the extensions 24b. However, if different materials for the extensions 24b and the via 1 structures 28 are either desired or necessary, then different masking cycles are preferably used to form these structures.

Most preferably, the structures as described herein are formed using traditional materials and processes, and only the design of the integrated circuit 10 is changed thus far, such as by adding the support structures 24, and in some embodiments by the addition of the etch stop layer 16.

Figure 9:
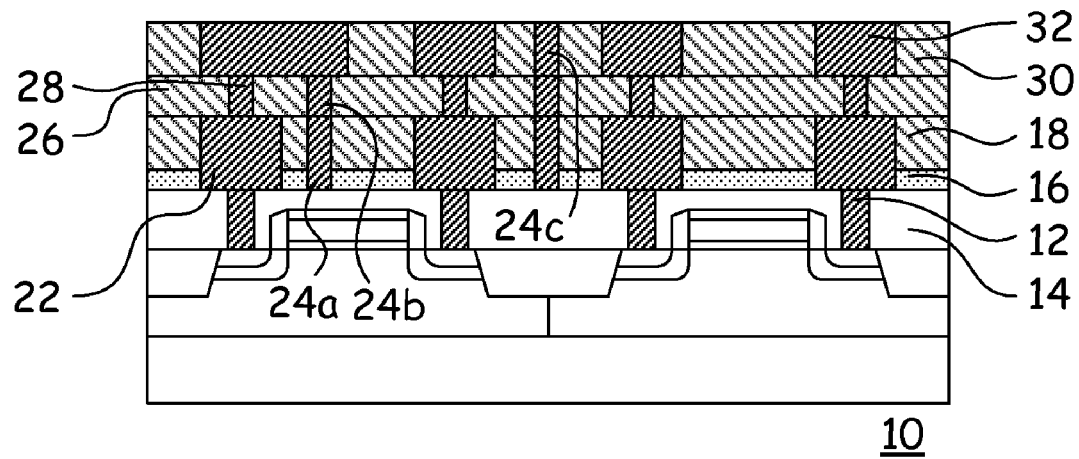
FIG. 9 is a cross sectional depiction of an integrated circuit after additional M layers and support extensions have been formed.
Figure 10:
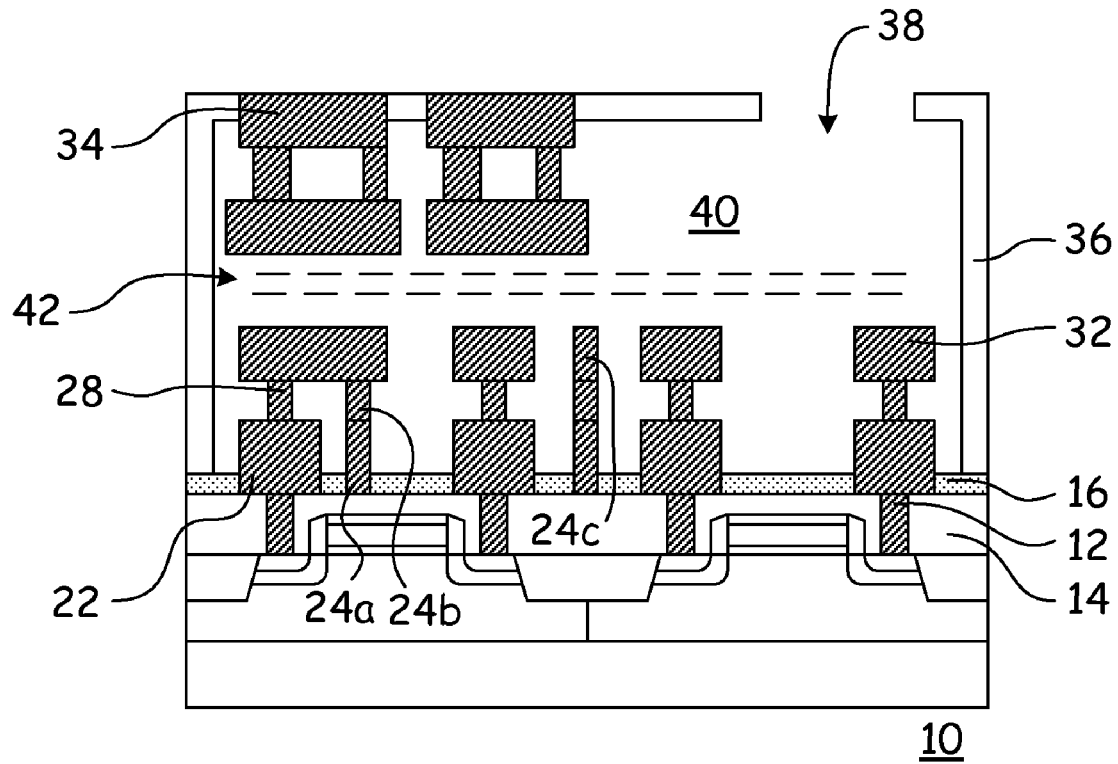
FIG. 10 is a cross sectional depiction of an integrated circuit after the inter metal dielectric layers have been stripped, and an optional passivation layer has been formed.

As depicted in FIG. 9, the processes as described above are generally repeated for an M2 layer, incorporating a dielectric layer 30, M2 interconnect structures 32, and support extensions 24c. The deposition, masking, etching, depositing, and planarizing steps traditionally used and as described above are preferably repeated at this point to form the structures as depicted in FIG. 9. These processes are preferably repeated as desired until a top metal layer 34 is formed, as depicted in FIG. 10.

Once the top metal layer 34 is formed, all of the dielectric layers such as 18, 26, and 30 are preferably removed, such as by using a wet etch with an etchant that removes the material of those inter metal dielectric layers, but which does not remove, or which removes at a substantially slower rate, the materials of the interconnects, vias, and support structures 24, or the etch stop layer 16. In this manner, substantially no material is left between the interconnects, and the lowest possible k value is attained. Most preferably, a hydrofluoric acid solution is used as the etchant to the remove the dielectric materials.

In some embodiments, a passivation layer 36 is formed, which passivation layer 36 is preferably formed of a material that is not etched at an appreciable rate by the etchant that is used to remove the dielectric layers between the interconnects. A slit 38 is preferably formed in the passivation layer 36, so that the etchant can reach the dielectric layers. When such a passivation layer 36 is used, a void 40 exists within the integrated circuit 10. The void 40 can be filled with an inert gas, rather than just air, which may tend to improve the electric field breakdown between the conductive metal lines. In addition, a vacuum can be drawn within the void 40, further reducing the k value towards one. Subsequent processing of the integrated circuit 10 preferably proceeds according to standard processing techniques. The dashed lines 42 indicate that there may be many more free-standing conductive layers within the integrated circuit 10 than are depicted in FIG. 10.

As an alternative to that as described above, the inter metal dielectric layers can be formed of a low k stack, such as by way of spin-on materials or plasma enhanced chemical vapor deposition methods. Again, it is preferred to use materials that can be removed by plasmas, solvents, or acids. The alternate steps are provided below. 1) The inter metal layers can be formed of photoresist, silicon based materials, or organic based porous materials, such as those used in low k materials. 2) Litho etch the dual damascene structures. 3) Deposit the barrier seed films, such as by PVD, CVD, ALD, etc. 4) Cu plating of the dual damascene structures. 5) Cu CMP or electropolish of the Cu film and Barrier seed layers. 6) Removal of the material between the Cu Dual Damascene structures in the following categories: a) Plasma methods using the following chemistries in combination or as reducing chemistries. Can be done by way of anisotropic or isotropic plasmas: $O_2$, $C_xF_y$, $NH_3$, $H_2$, $CH_xF_y$, etc. b) Solvent methods such as by using amine based solvents to remove resist based materials. Can be used in conjunction with plasma methods. c) Acid based methods such as by using dilute BOE, HF, or sulfuric components to remove oxide based materials.

7) An optional additional step is to provide low k materials in portions of specific layers between the interconnect structures, such as to support long lines between the vias. This material is preferably added after other materials have been removed, but can be originally formed and left in place. These materials can be of PECVD, CVD, and spin on materials, such as are known in the art.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. In an integrated circuit, the improvement comprising:
an etch stop layer overlying front end processing layers of the integrated circuit, support structures disposed so as to support electrically conductive interconnects on various levels of the integrated circuit,
substantially complete voids disposed between the interconnects, caused by removing substantially all non electrically conductive layers above the etch stop layer that were formed during fabrication of the interconnects, and a passivation layer overlying the interconnects, the passivation layer forming a void, wherein the void is filled with one of an inert gas and a vacuum.

2. The integrated circuit of claim 1, wherein the etch stop layer is formed of at least one of silicon nitride and silicon carbide.

3. The integrated circuit of claim 1, wherein the support structures are formed at least in part of a material that is used to form the interconnects.

4. The integrated circuit of claim 1, wherein at least one of the support structures and the interconnects are formed of metal.

* * * * *